United States Patent [19]

Hsu et al.

[11] Patent Number: 5,567,631
[45] Date of Patent: Oct. 22, 1996

[54] METHOD OF FORMING GATE SPACER TO CONTROL THE BASE WIDTH OF A LATERAL BIPOLAR JUNCTION TRANSISTOR USING SOI TECHNOLOGY

[75] Inventors: Ching-Hsiang Hsu, Hsin Chu; Shyh-Chyi Wong, Taichang; Mong-Song Liang, Hsin Chu; Steve S. Chung, Hsin Chu, all of Taiwan

[73] Assignee: Taiwan Semiconductor Manufacturing Company, Hsin Chu, Taiwan

[21] Appl. No.: 557,654

[22] Filed: Nov. 13, 1995

[51] Int. Cl.[6] ................................. H01L 21/265
[52] U.S. Cl. ................. 437/32; 437/31; 437/59; 437/62; 437/34; 437/917; 148/DIG. 9; 148/DIG. 96
[58] Field of Search ................. 437/32, 62, 40, 437/41, 44, 34, 59, 31, 917; 148/DIG. 9, DIG. 96

[56] References Cited

U.S. PATENT DOCUMENTS

| | | | |
|---|---|---|---|
| 5,049,513 | 9/1991 | Eklund | 437/34 |
| 5,100,810 | 3/1992 | Yoshimi et al. | 437/32 |
| 5,164,326 | 11/1992 | Foerstner et al. | 437/59 |
| 5,185,280 | 2/1993 | Houston et al. | 437/44 |
| 5,258,318 | 11/1993 | Buti et al. | 437/59 |
| 5,273,915 | 12/1993 | Hwang et al. | 437/59 |
| 5,294,821 | 3/1994 | Iwamatsu | 257/351 |
| 5,424,225 | 6/1995 | Yamaguchi et al. | 437/44 |
| 5,426,062 | 6/1995 | Hwang | 437/34 |
| 5,440,161 | 8/1995 | Iwamatsu et al. | 437/40 |

*Primary Examiner*—Tuan H. Nguyen
*Attorney, Agent, or Firm*—George O. Saile

[57] ABSTRACT

A process has been developed in which narrow base width, lateral bipolar junction transistors, and narrow channel length MOSFET devices, can be simultaneously fabricated, using a silicon on insulator approach. Insulator sidewall spacer and gate processing is used to produce narrow base widths for enhanced collector—base device characteristics, in terms of transistor gain, switching speeds and junction breakdowns.

18 Claims, 6 Drawing Sheets

METHOD OF FORMING GATE SPACER TO CONTROL THE BASE WIDTH OF A LATERAL BIPOLAR JUNCTION TRANSISTOR USING SOI TECHNOLOGY

BACKGROUND OF THE INVENTION

1. Field of the Invention

This invention relates to the fabrication of a semiconductor devices and more specifically to semiconductor devices fabricated from silicon on insulator, (SOI), technology.

2. Description of Prior Art

The objective of the semiconductor industry to continually improve chip performance has in part been satisfied by the trend to micro-miniaturazation. The ability of specific semiconductor disciplines to reduce critical silicon chip shapes and images have allowed sub-micron features to be routinely achieved. Photolithograhy, via use of more sophisticated exposure cameras, as well an the development of more sensitive photoresist materials, has been a major contributor allowing micro-miniaturazation to occur. Reactive ion etching, (RIE), allowing for the successful transfer of these sub-micron images in photoresist, to underlying semiconductor materials; has also played a major role in the trend to micro-miniaturazation, The ability to produce smaller shapes results in reductions in parasitic capacitances, which in turn improve the performance of these devices. However the approach of increasing performance, via micro-miniaturization, can be ultimately limited by the ability of the specific semiconductor fabrication disciplines to continually construct smaller devices.

Another method used to increase device performance, via decreasing parasitic capacitances, is by the silicon on insulator, (SOD, technology. In this technology a thin layer of single crystalline silicon resides on a insulator. The active device regions are created within the single crystalline silicon, which overlies the insulator. Therefore the high junction capacitance, observed with devices fabricated without SOI is significantly decreased with SOI, due to the absence of junction capacitance associated with an underlying silicon substrate.

The advances in the SOI technology have created many opportunities for device designers, for both bipolar junction transistor, (BJT), as well as complimentary metal oxide semiconductor, (CMOS), applications. Furthermore the SOI technology allows an easier process sequence to be used for fabrication of bipolar—CMOS, (BiCMOS), designs. Prior art, such as Houston, et al, in U.S. Pat. No. 5,185,280, and lwamatsu, et al, in U.S. Pat. No. 5,294,281, have described methods for making integrated circuits using SOI However these inventions do not show the specific techniques used to produce competitive BJT devices, that this invention will teach. This invention will describe a process for fabricating lateral NPN, bipolar junction transistors, using SOI technology, with optimized device parameters, such as base to collector breakdown voltage, as well as transistor gain, beta, using process sequences normally used for the fabrication of metal oxide semiconductor field effect transistors, (MOSFET), devices, and therefore extendable for use in BiCMOS applications

SUMMARY OF THE INVENTION

It is an object of this invention to fabricate both bipolar junction transistors, as well as MOS devices, using SOI technology.

It is another object of this invention to provide a process sequence which allows lateral bipolar junction transistors to be easily fabricated using process steps similar to process steps used to create MOS devices.

It is yet another object of this invention to provide both bipolar junction transistors and MOS devices with small parasitic capacitances due to the use of SOI technology.

It is still yet another object of this invention to use a polysilicon gate spacer to fabricate lateral bipolar junction transistors with enhanced device characteristics, such as transistor gain as well as collector to base breakdown voltages.

In accordance with the present invention a P type, single crystalline silicon layer is present on semiconductor substrate having a silicon oxide film on the surface of the semiconductor substrate. Thick oxide regions are thermally grown for purposes of isolation, followed by growth of a thin silicon dioxide layer, to be used as the gate oxide for the MOSFET device. A polysilicon layer is grown, doped via ion implantation processes, and patterned to produce a polysilicon gate structure for the MOSFET device, and to partially define the base width of the lateral bipolar junction transistor. Specific photoresist masking of the lateral bipolar junction transistor allows the creation of a lightly doped collector region via ion implantation, while the same implantation creates the lightly doped source and drain region for the unmasked MOSFET device. Gate spacers are created on the sidewall of the polysilicon gate structure via deposition of, and anisotropic etching of, an insulator layer. A heavily doped, blanket ion implantation is performed to create the emitter and collector regions of the lateral bipolar junction transistor, while the same implant creates the source and drain regions of the MOSFET device.

BRIEF DESCRIPTION OF THE DRAWINGS

The object and other advantages of this invention are best described in the preferred embodiment with reference to the attached drawings that include:

FIGS. 3a–6a, schematically, in cross-sectional style, showing the stages of fabrication used to create the lateral bipolar junction transistor.

FIGS. 3b–6b, schematically, in cross-sectional styles showing the stages of fabrication used to create the MOSFET device.

DESCRIPTION OF THE PREFERRED EMBODIMENTS

The method of creating a lateral bipolar junction transistor with enhanced bipolar device characteristics, via use of a gate spacer resulting in narrow base widths, in addition to creating a MOSFET device, will now be described.

Figure 1:
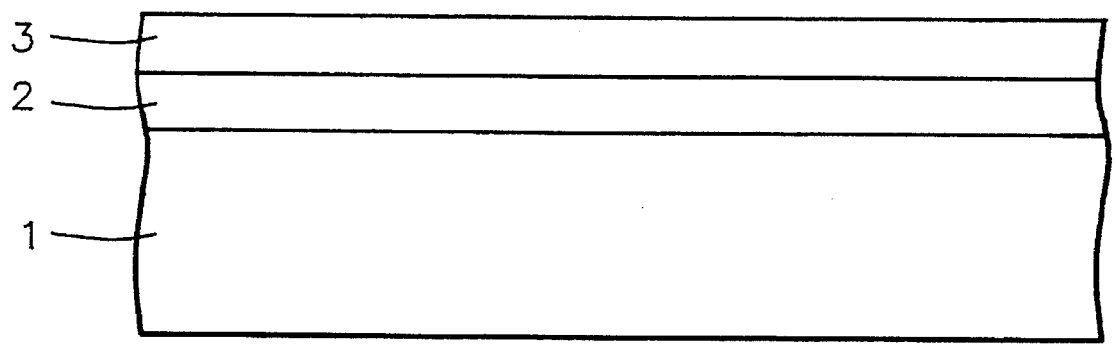
FIGS. 1–2, schematically, in cross-sectional style, showing the early stages of fabrication used to prepare a semiconductor substrate for subsequent creation of both lateral bipolar junction transistor and a MOSFET device.

FIG. 1, shows a starting substrate, 1, with a silicon oxide region, 2, and the silicon on insulator layer, 3. The method to produce the silicon on insulator, (SOI) is the SIMOX, (Separation by IMplanted OXygen), process. This process results in a P type, single crystalline silicon layer, having a <100> crystallographic orientation, with a resistivity between about 15 to 25 ohm - cm, and a thickness between about 500 to 2000 Angstroms. The defect density of the SOI layer, 3, is less than about 1E4 defects/cm$^2$.

Figure 2:
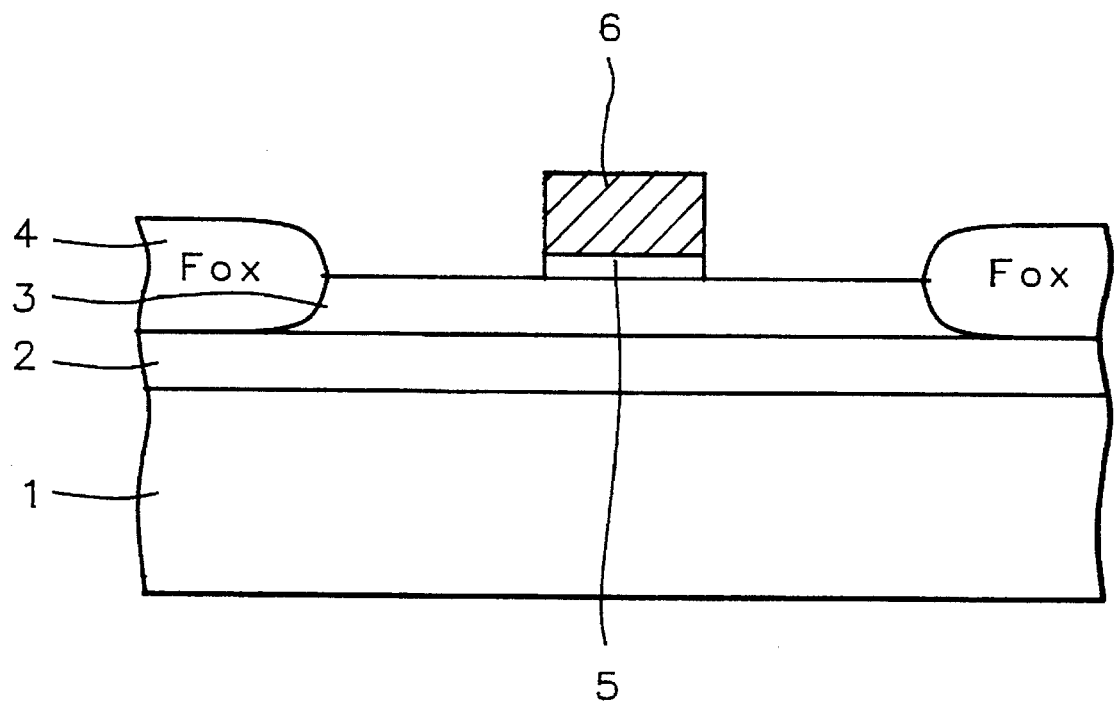

FIG. 2, next describes the creation of a thick field oxide, 4, (FOX), thermally grown using a chemically vapor deposited silicon nitride, and a silicon oxide, composite, as an oxidation mask. The composite mask is patterned via conventional photolithographic and reactive ion etching procedures. The FOX regions, 4, are thermally grown in an oxygen—steam ambient, to a thickness between about 2000 to 6000 Angstroms, at a temperature between about 900° to 1150° C. The thickness of the FOX region, 4, is designed to consume the SOI layer, 3, in the unmasked areas, to provide the required device isolation. After removal of the oxidation masking composite, using hot phosphoric acid for the silicon nitride layer and a buffered hydrofluoric acid for the underlying silicon oxide masking layer, a thin silicon dioxide layer, 5, is thermally grown at a temperature between about 800° to 1000° C., to a thickness between about 40 to 200 Angstroms. The silicon oxide layer, 5, will be used as the gate insulator for the subsequent MOSFET device. A polysilicon layer, 6, shown in FIG. 2, is next deposited, at a temperature between about 500° to 650° C., to a thickness between about 1200 to 3000 Angstroms. This layer can either be deposited using insitu doping, adding either phosphine or arsine to the silane ambient, or the polysilicon can be grown intrinsically and doped via ion implantation of phosphorous, at an energy between about 50 to 100 Kev., at a dose between about 1E14 to 1E16 atoms/cm$^2$. Standard photolithographic and reactive ion etching procedures are then employed to create the polysilicon structure, 6, shown schematically in FIG. 2. The width of polysilicon structure, 6, creating the channel length for the MOSFET, and the base width for the bipolar junction devices, will be a critical dimension in determining the performance of these devices. The width of polysilicon layer, 6, used is between 0.1 to 1.0 micrometers.

Figure 3A:
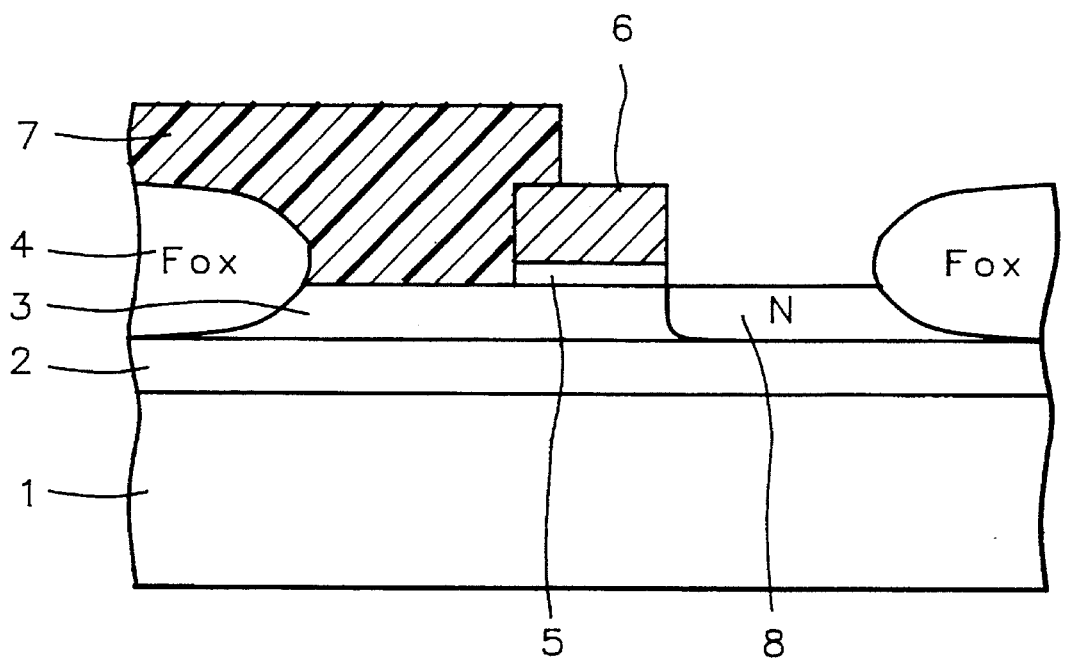
Figure 3B:
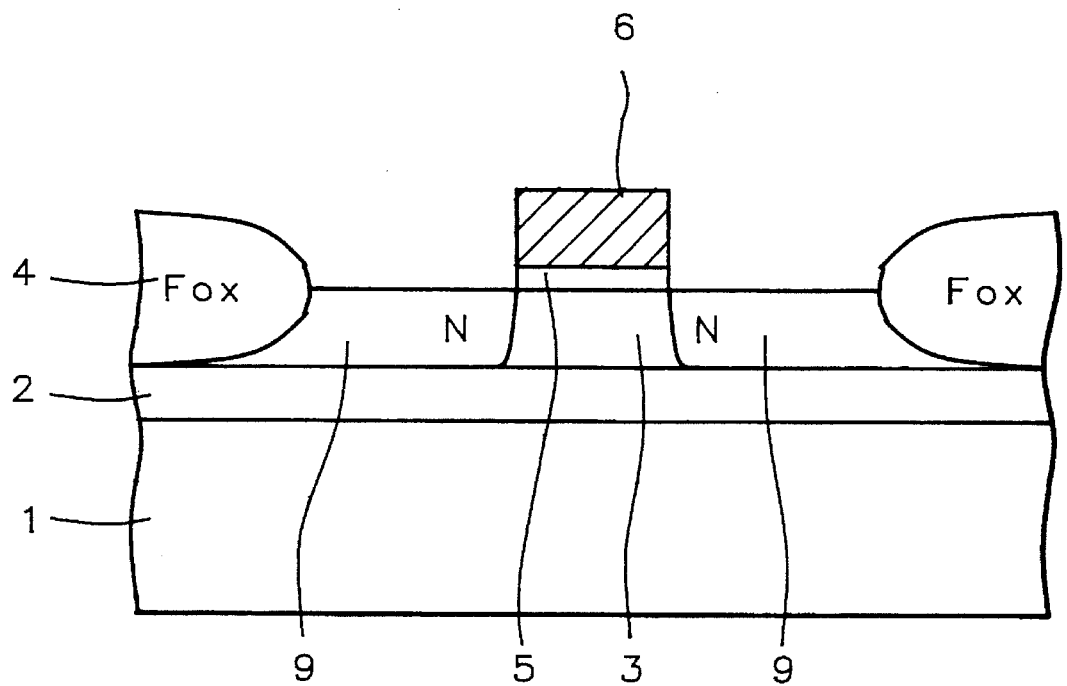
Figure 4A:
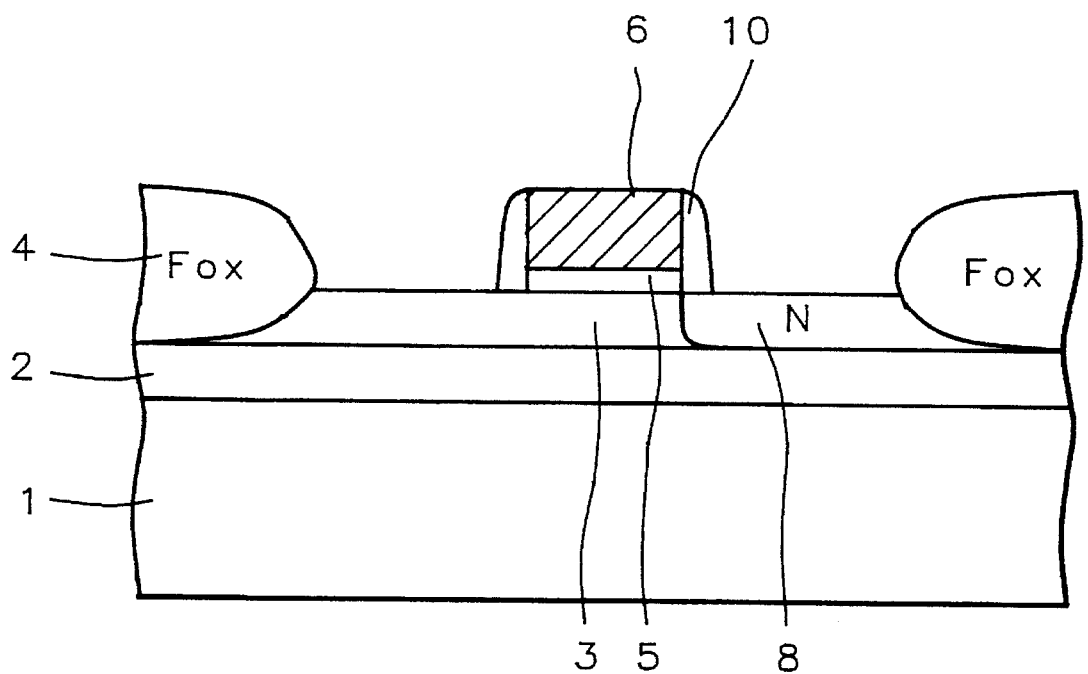
Figure 4B:
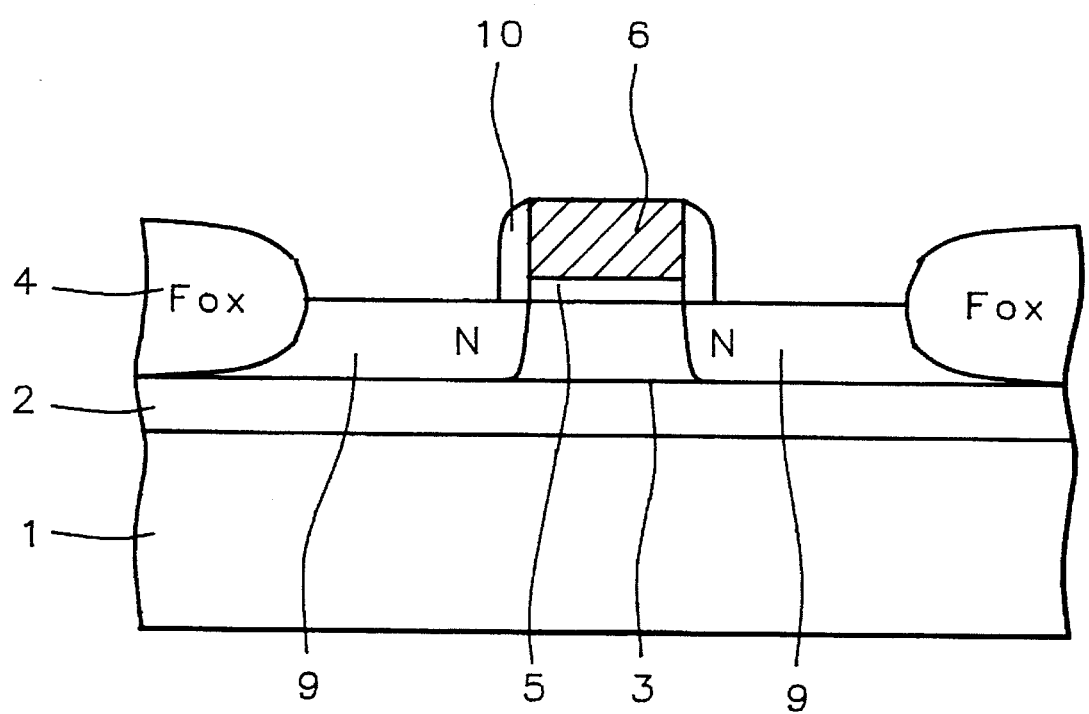

FIG. 3a, indicates the continuation of the fabrication process used to produce the lateral bipolar junction transistor. A photoresist pattern, 7, is used to allow the creation of a lightly doped collector region, 8, to be obtained via ion implantation of arsenic or phosphorous, at an energy between about 30 to 80 Kev., at a dose between about 1E12 to 1E14 atoms/cm$^2$. Referring to FIG. 3b, the identical ion implantation process is performed to an unmasked MOSFET device, producing the lightly doped source and drain regions, 9. The gate spacer, or the insulator sidewall spacer is next created, on the sides of polysilicon structure, 6. First a layer of silicon oxide is deposited using either low pressure chemical vapor deposition, (LPCVD), or plasma enhanced chemical vapor deposition, (PECVD), at a temperature between about 600° to 800° C., to a thickness between about 800 to 2500 Angstroms. The insulator sidewall spacer is next formed via use of a selective, anisotropic reactive ion etching process, using a CHF$_3$ etch chemistry, to create insulator sidewall spacers, 10, shown schematically for both the lateral bipolar junction transistor and MOSFET device, shown in FIG. 4a and FIG. 4b.

Figure 5A:
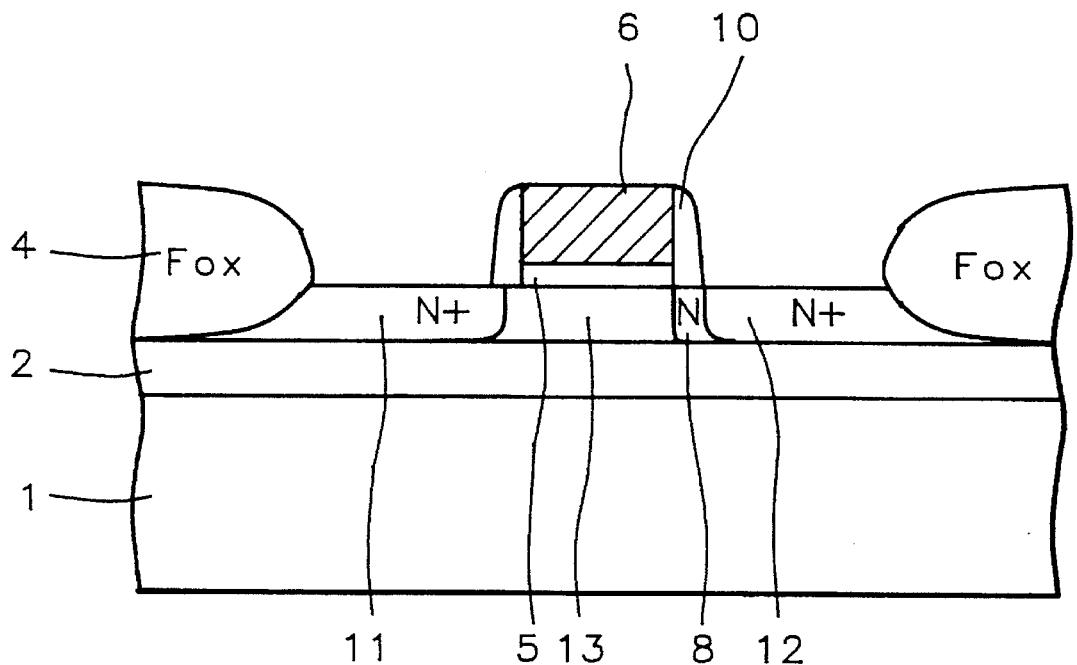
Figure 5B:
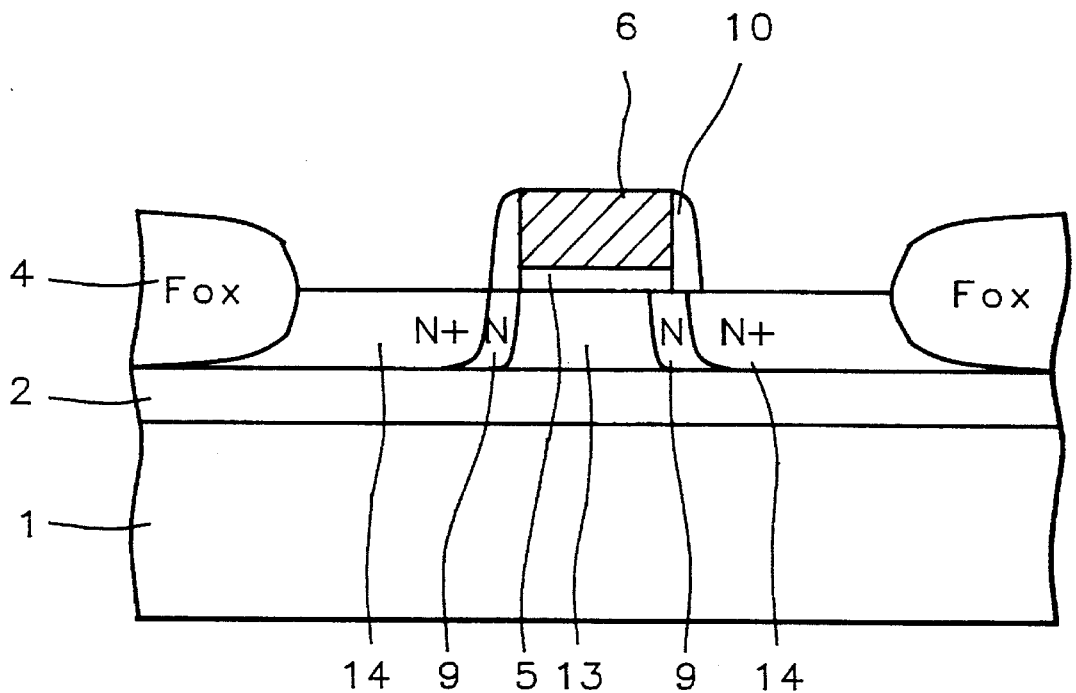

A heavily doped, N type, ion implantation step is next employed to create emitter region, 11, and high concentration collector region, 12, for the lateral bipolar junction transistor, leaving a P type base region, 13, shown in FIG. 5a. The same implantation process also creates the heavily doped, N type, source and drain regions, 14, for the MOSFET device, shown in FIG. 5b. Referring to the lateral bipolar junction transistor, shown in FIG. 5a, it is critical to the performance of this device to use insulator sidewall spacer, 10. The ability to produce a collector—base junction, via use of the lightly doped collector region, 8, will result in a significantly higher collector to base breakdown voltage then would have resulted from an collector—base junction, via use of the heavily doped collector region, 12. The improved collector to base breakdown voltage allows these devices to perform at higher operating conditions. In addition the use of the insulator sidewall spacer allows more exacting control of base region 13. The ability to create narrow base regions using this process results in an increase for both transistor switching speed and transistor gains. The switching speed is directly related to the width of the base regions while transistor gain, or beta, is also influenced by the width and doping level of the base region, 13. The combination of creating fast bipolar junction transistors, resulting from the use of the insulator sidewall spacer and small polysilicon gate widths, along with the reduced parasitic capacitances, realized via the SOI process, results in significant performance benefits. The heavily doped, ion implantation is performed using arsenic, ion implanted at an energy between about 30 to 80 Kev., at a dose between about 1E14 to 1E16 atoms/cm$^2$.

Figure 6A:
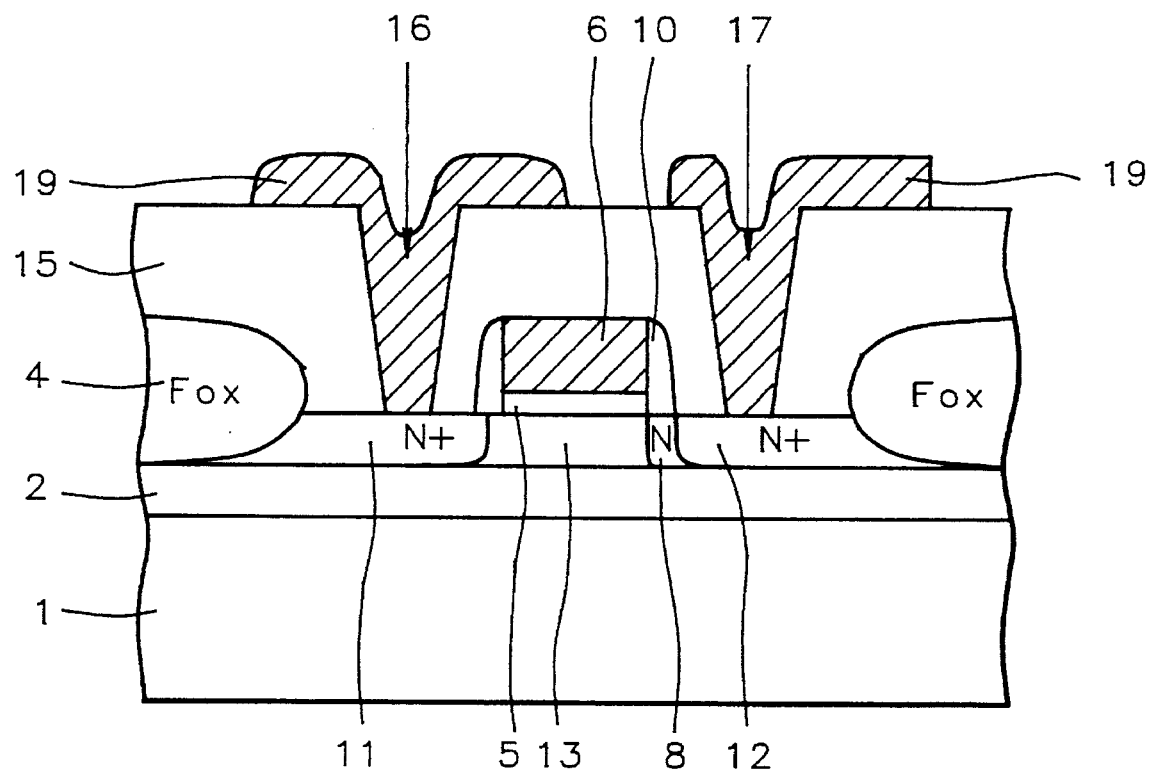
Figure 6B:
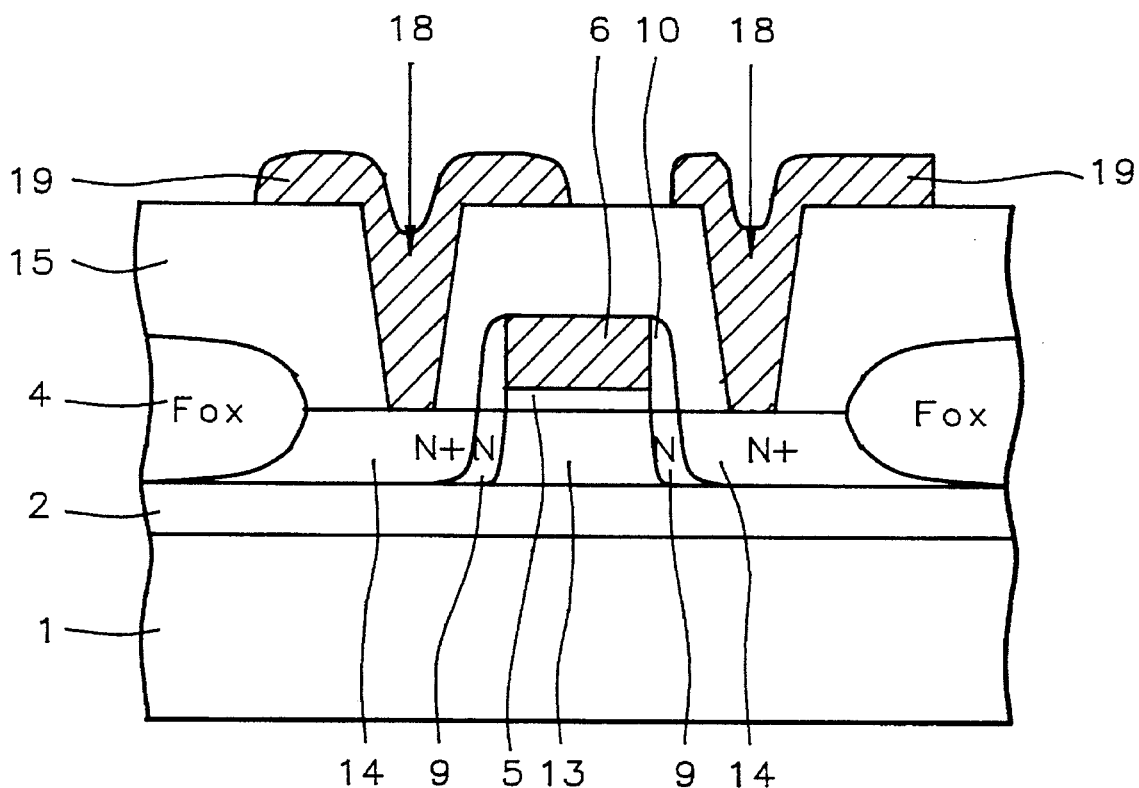
Figure 7:
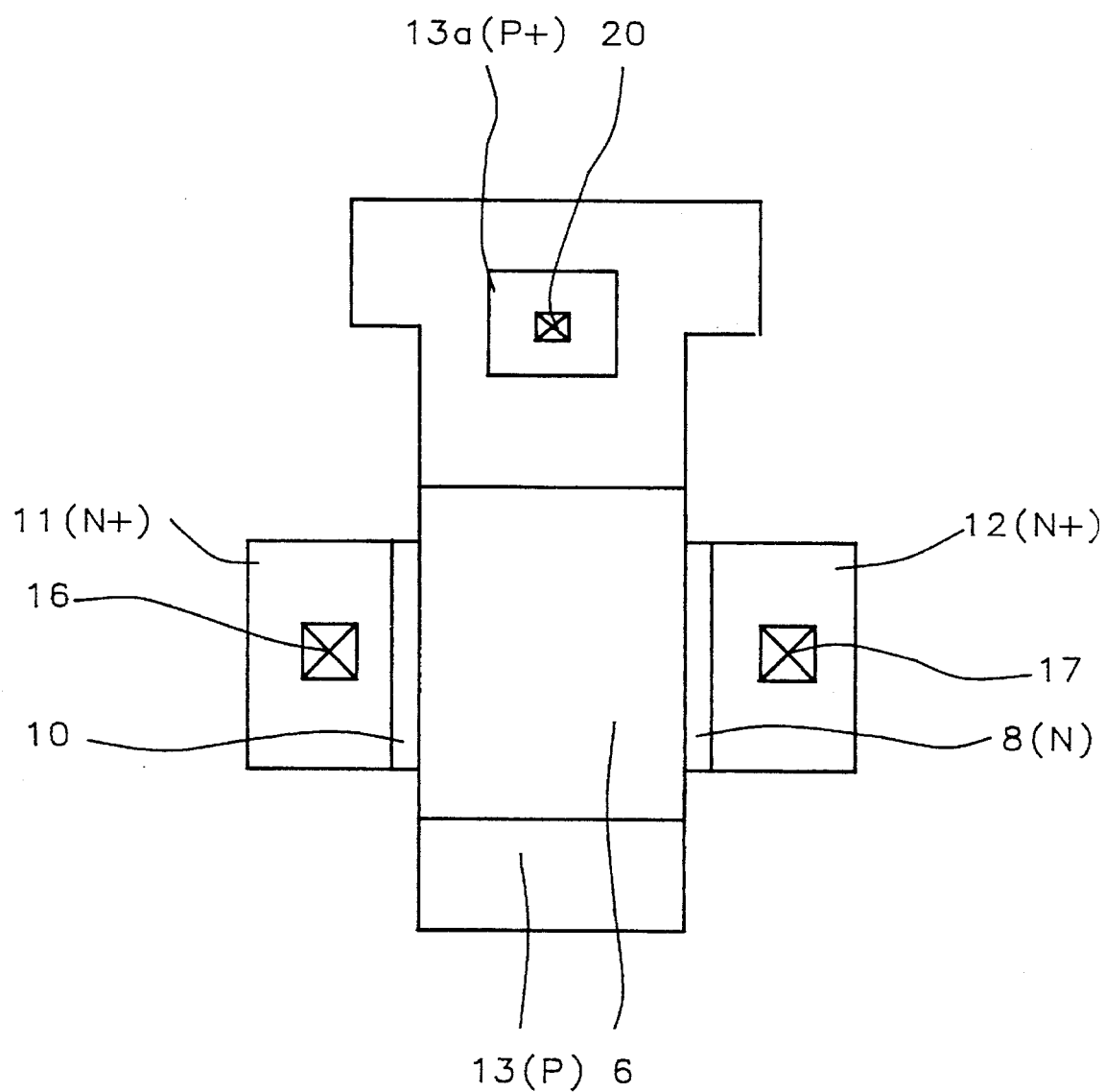
FIG. 7, schematically showing the top view of the lateral bipolar transistor.

A layer of silicon oxide, 15, is next deposited using either LPCVD or PECVD processing, at a temperature between about 300° to 450° C., to a thickness between about 5000 to 7000 Angstroms. FIG. 6a, shows the creation of contact hole, 16, to emitter region, 11, contact hole, 17, to heavily doped collector region, 12, while FIG. 6b, shows the creation of contact hole, 18, to heavily doped source and drain region, 14. The contact holes are created using conventional photolithographic and reactive ion etch processing, using a CHF$_3$ etch chemistry. Contact holes to the base region of the lateral bipolar junction transistor, as well as to the polysilicon gate of the MOSFET device, are also created, but not shown in FIGS. 6a and 6b. After photoresist removal, via oxygen plasma ashing, followed by careful wet cleans, a deposition of an aluminum based metallurgy is made, to a thickness between about 4000 to 6000 Angstroms. Again conventional photolithographic and reactive ion etching procedures, using a chlorine etch chemistry, are used to produce metal structure, 19, shown schematically in FIGS. 6a and 6b. FIG. 7, shows the top view, or layout of the lateral bipolar junction transistor. A contact, 20, to base region, 13, is also shown. A heavily doped P type region, (13a), was created using conventional photolithographic and ion implantation procedures, using BF$_2$, to form a contact region for the base.

Although this process for fabricating enhanced lateral bipolar junction transistors, has been shown using an N type MOSFET, applications can be accommodated to easily include P type MOSFET devices, to achieve BiCMOS fabrication processing.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a lateral bipolar junction transistor, in a layer of silicon on insulator, on a semiconductor substrate, comprising the steps of:

providing said semiconductor substrate;

providing said silicon on insulator layer on said semiconductor substrate;

growing field oxide regions on specific areas of said silicon on insulator layer;

growing a first insulator layer on surface of said silicon on insulator layer, not covered by said field oxide regions;

depositing a polysilicon layer on said first insulator layer and on said field oxide regions;

ion implanting a first conductivity imparting dopant into said polysilicon layer;

patterning of said polysilicon layer to form polysilicon gate structure;

photoresist masking to expose specific region of said silicon on insulator layer;

ion implanting a second conductivity imparting dopant into said specific region of said silicon on insulator layer, not covered by said photoresist masking, not covered by said field oxide regions, and not covered by said polysilicon gate structure, to form lightly doped collector region of said lateral bipolar transistor;

removal of said photoresist masking;

deposition of a second insulator layer, on said silicon on insulator layer, on said polysilicon gate structure, and on said field oxide region;

anisotropic etching of said second insulator layer to form insulator sidewall spacer on sides of said polysilicon gate structure;

ion implanting a third conductivity imparting dopant into said silicon on insulator layer, not covered by said field oxide region, not covered by said polysilicon gate structure, and not covered by said insulator sidewall spacer to form heavily doped emitter and heavily doped collector regions of said lateral bipolar junction transistor;

deposition of a third insulator layer, on silicon on insulator layer, on said polysilicon gate structure, and on said field oxide regions;

opening contact holes in said third insulator layer, to said silicon on insulator layer;

deposition of a metal on said third insulator layer, and on said silicon on insulator layer, exposed in said contact hole; and forming metal contact structures to said specific said silicon on insulator region, exposed in said contact hole.

2. The method of claim 1, wherein said silicon on insulator layer, is produced via the SIMOX process, resulting in a P type single crystalline, silicon layer, with a <100> crystallographic orientation, having a resistivity between about 15 to 25 ohm - cm, and a thickness between about 500 to 2000 Angstroms.

3. The method of claim 1, wherein said first insulator layer is silicon dioxide, thermally grown in an oxygen—steam ambient, at a temperature between about 800° to 1000° C., to a thickness between about 40 to 200 Angstroms.

4. The method of claim 1, wherein said polysilicon layer is deposited intrinsically, using LPCVD processing, at a temperature between about 500° to 650° C., to a thickness between about 1200 to 3000 Angstroms.

5. The method of claim 1, wherein said first conductivity imparting dopant is phosphorous, ion implanted at an energy between about 50 to 100 Kev., at a dose between about 1E14 to 1E16 atoms/cm$^2$.

6. The method of claim 1, wherein said polysilicon layer is patterned using reactive ion etching using a chlorine based etch chemistry, resulting in said polysilicon gate structure with a width between about 0.1 to 1.0 micrometers.

7. The method of claim 1, wherein said second conductivity imparting dopant is arsenic or phosphorous, ion implanted at an energy between about 30 to 80 Kev., at a dose between about 1E12 to 1E14 atoms/cm$^2$.

8. The method of claim 1, wherein said second insulator layer is silicon oxide, deposited using either LPCVD or PECVD processing, at a temperature between about 600° to 800° C., to a thickness between about 800 to 2500 Angstroms.

9. The method of claim 1, wherein said third conductivity imparting dopant is arsenic, ion implanted at an energy between about 30 to 80 Kev., at a dose between about 1E14 to 1E16 atoms/cm$^2$.

10. A process for fabricating, lateral bipolar junction transistors and MOSFET devices, in a layer of silicon on insulator, on a semiconductor substrate, comprising the steps of:

providing said semiconductor substrate;

providing said silicon on insulator layer, on said semiconductor substrate;

growing field oxide regions on specific areas of said silicon on insulator layer;

growing a first insulator layer on surface of said silicon on insulator layer, not covered by said field oxide regions;

depositing a polysilicon layer on said first insulator layer and on said field oxide regions;

ion implanting a first conductivity imparting dopant into said polysilicon layer;

photoresist masking to expose regions of said silicon on insulator layer;

ion implanting a second conductivity imparting dopant into said exposed regions of said silicon on insulator layer, not covered by said photoresist masking, not covered by said field oxide regions and not covered by said polysilicon gate structure, to form lightly doped collector region of said lateral bipolar transistor, and to form lightly doped source and drain region of said MOSFET device;

removal of said photoresist masking;

deposition of a second insulator layer on said silicon on insulator layer, on said field oxide region, and on said polysilicon gate structure;

anisotropic etching of said second insulator layer to form insulator sidewall spacer on sides of said polysilicon gate structure;

ion implanting a third conductivity imparting dopant into areas of said silicon on insulator, not covered by said field oxide regions, not covered by said polysilicon gate structure, and not covered by said insulator sidewall spacer, to form heavily doped emitter and heavily doped collector regions of said lateral bipolar junction transistor, and to form heavily doped source and drain regions of said MOSFET device;

deposition of a third insulator layer on said silicon on insulator layer, on said polysilicon gate structure, and on field oxide regions;

opening contact holes in said third insulator layer to said heavily doped emitter, to said heavily doped collector, and to base regions, of said lateral bipolar junction transistor, and to said heavily doped source and drain regions, and to said polysilicon gate structure of said MOSFET device;

deposition of metal on said third insulator layer, and on said heavily doped emitter, on said heavily doped collector, and on said base region, of said lateral bipolar junction transistor, exposed in said contact hole, and on said heavily doped source and drain region, and on said polysilicon gate structure, of said MOSFET device, exposed in said contact hole; and forming metal contact structures to said heavily doped emitter, to said heavily doped collector, and to said base regions, of said lateral bipolar junction transistor, and to said heavily doped source and drain regions, and to said polysilicon gate structure of said MOSFET device.

11. The method of claim 10, wherein said silicon on insulator layer is produced via the SIMOX process, resulting in a P type, single crystalline silicon layer, having a <100> crystallographic orientation, with a resistivity between about 15 to 25 ohm - cm, and a thickness between about 500 to 2000 Angstroms.

12. The method of claim 10, wherein said first insulator layer is silicon dioxide, thermally grown in an oxygen-steam ambient, at a temperature between about 800° to 1100° C., to a thickness between about 40 to 200 Angstroms.

13. The method of claim 10, wherein said polysilicon layer is deposited using LPCVD processing, at a temperature between about 500° to 650° C., to a thickness between about 1200 to 3000 Angstroms.

14. The method of claim 10, wherein said first conductivity imparting dopant is phosphorous, ion implanted at an energy between about 50 to 100 Kev., at a dose between about 1E14 to 1E16 atoms/$cm^2$.

15. The method of claim 10, wherein said polysilicon layer is patterned via reactive ion etching, using a chlorine etch chemistry, to form said polysilicon gate structure with a width between about 0.1 to 1.0 micrometers.

16. The method of claim 10, wherein said second conductivity imparting dopant, used to form said lightly doped collector region of said lateral bipolar junction transistor, and to form lightly doped source and drain regions of said MOSFET device, is arsenic, or phosphorous, ion implanted at an energy between about 30 to 80 Kev., at a dose between about 1E12 to 1E14 atoms/$cm^2$.

17. The method of claim 10, wherein said second insulator layer is silicon oxide, deposited using either LPCVD or PECVD processing, at a temperature between about 600° to 800° C., to a thickness between about 800 to 2500 Angstroms.

18. The method of claim 10, wherein said third conductivity imparting dopant, used to form said heavily doped emitters and said heavily doped collector regions of said lateral bipolar junction transistor, and to form said heavily doped source and drain regions of said MOSFET device, is arsenic, ion implanted at an energy between about 30 to 80 Kev., at a dose between about 1E14 to 1E16 atoms/$cm^2$.

* * * * *